United States Patent [19]
Brown et al.

[11] Patent Number: 5,993,251
[45] Date of Patent: Nov. 30, 1999

[54] STAGGERED FACEPLATE

[75] Inventors: Michael Brown; Mark Sonderegger, both of Orleans; Pak-Jong Chu, Nepean, all of Canada

[73] Assignee: Nortel Networks Corporation, Montreal, Canada

[21] Appl. No.: 08/996,173

[22] Filed: Dec. 22, 1997

[51] Int. Cl.[6] .................................................. H01R 13/60
[52] U.S. Cl. ...................................... 439/540.1; 439/954
[58] Field of Search ................................ 439/540.1, 716, 439/717, 924.1, 924.2, 701, 144, 954

[56] References Cited

U.S. PATENT DOCUMENTS

| | | | |
|---|---|---|---|
| 4,239,324 | 12/1980 | Stenz | 339/198 |
| 5,605,466 | 2/1997 | Devlin et al. | 439/144 |

Primary Examiner—Michael L. Gellner
Assistant Examiner—Antoine Ngandjui

[57] ABSTRACT

The present invention relates to an improved faceplate used in a connector assembly for electrical, electronic and optical applications. The faceplate has a staggered profile from the leading end to the trailing end, thereby providing a row of mating surfaces. Each successive mating surface being lower than the preceding one. At least one internal connector is disposed on each mating surface. The rear of each internal connector is connected to electrical, electronic or optical equipment. Respective external mating connectors mate with the front of each respective internal connector in a mating direction towards the faceplate. A cable is secured to each external mating connector and extends generally perpendicular with respect to the mating direction and towards the trailing end of the faceplate. The staggered profile accommodates or at least partly accommodates the cables secured to the external mating connectors.

20 Claims, 14 Drawing Sheets

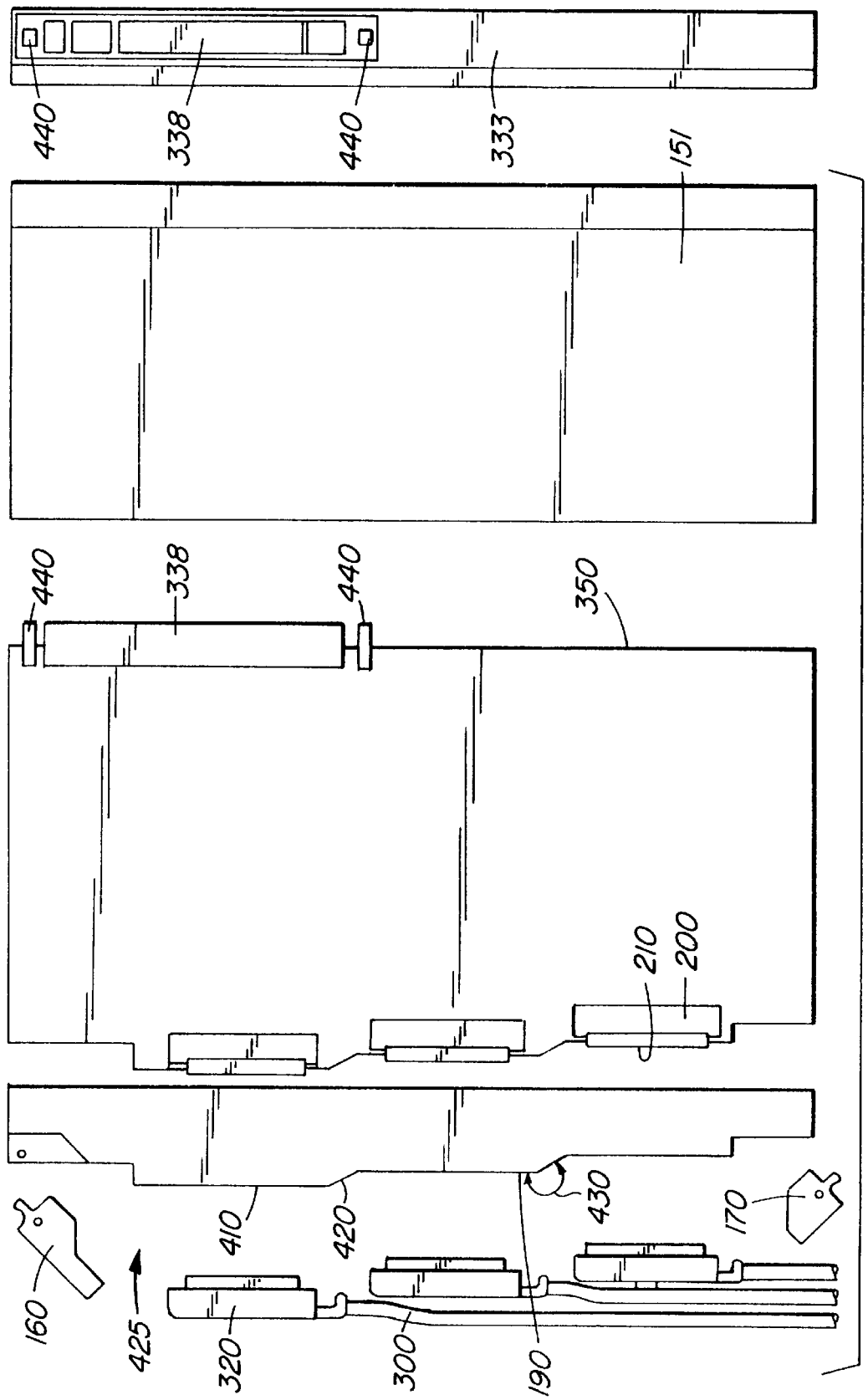

STAGGERED FACEPLATE

FIELD OF THE INVENTION

The present invention relates to an improved faceplate used in a connector assembly for electrical, electronic and optical applications.

BACKGROUND OF THE INVENTION

It is common to house electronic, electrical and/or optical devices in a module with a faceplate. The faceplate has a leading end and a trailing end. One or more internal connectors are disposed on the faceplate for interconnecting with external mating connectors. Cables are attached to these external mating connectors. For instance, the telecommunications industry uses modules of this nature for switching and PBX applications. Copper lines or fibre optic lines from the phone company are connected to the cabinet. Copper cables or fibre optic cables attached to external mating connectors mate with the internal connectors in a mating direction which is generally perpendicular to the faceplate. The cables generally run at right angles to the mating direction and generally run towards the trailing end of the faceplate such that the cables extend over other internal connectors disposed on the faceplate towards the trailing end of the faceplate. The other end of the copper cables or fibre optic cables are typically attached to phones or data equipment.

Typically, inside each cable are numerous smaller cables. Depending on the number of these smaller cables and the thickness of the smaller cables, the cable can be quite thick. If the internal connectors are placed too close to each other on the faceplate, the cables connected to the external complementary connectors can interfere with each other. In addition, more stress can be placed on the connection point or points where the cables are connected to the connectors. The stress may become so high that the cables may break or the connection point or points may break. These problems may even be greater if a number of modules, each with a faceplate are placed closely together in a cabinet.

Typically, modules, each with a faceplate, are placed in a cabinet if one wants the modules to be interconnected to each other. At the other end of the module, opposite the faceplate, there is typically a connector disposed that interconnects with a mating connector inside the cabinet. The mating connectors inside the cabinet are typically connected to each other by means of cables or by means of a common circuit board.

To solve these problems mentioned above, persons skilled in the art have used larger faceplates with sufficient spacing in between the internal connectors. Consequently, the module can become quite large. If a number of these modules are placed in a cabinet, the size of the cabinet can become excessive.

SUMMARY OF THE INVENTION

It is an object of the present invention to provide an improved faceplate used in an connector assembly in which the above mentioned problems are obviated or mitigated.

These and other objects will be apparent from the detailed specification and the accompanying drawings.

In accordance with one aspect of the present invention there is provided a staggered faceplate, having a leading end, a trailing end, a front and a rear, for receiving a plurality of internal connectors, attached to electrical, electronic or optical equipment. Each internal connector is adapted for selective mating in a mating direction towards the front of the staggered faceplate with a plurality of external complementary connectors. Each external complementary connector is secured to a cable extending generally perpendicular with respect to the mating direction and toward the trailing end of the staggered faceplate. The front of the staggered faceplate has a staggered profile between the leading end and the trailing end thereby providing a column or a row of mating surfaces for receiving at least one of the plurality of internal connectors. Each successive mating surface from the leading end to the trailing end is lower than the preceding mating surface, whereby the cables secured to the external complementary connectors are at least partly accommodated.

In accordance with another aspect of the present invention there is provided a connector assembly for interconnecting electrical, electronic or optical equipment to external connectors comprising a staggered faceplate having a front, a back, a leading end, and a trailing end, and a plurality of internal connectors, each having a front and a rear. The rear of each internal connector is connected to electrical, electronic or optical equipment. The front of the internal connectors is adapted for selective mating in a mating direction towards the front of the staggered faceplate with a plurality of external complementary connectors each secured to a cable extending generally perpendicular with respect to the mating direction and toward the trailing end of the staggered faceplate. The staggered faceplate further comprises a staggered profile between the leading end and the trailing end thereby providing a column or a row of mating surfaces. Each mating surface receives at least one of the plurality of internal connectors. Furthermore, each successive mating surface from the leading end to the trailing end is lower than the preceding one, whereby the cables secured to the external complementary connectors are at least partly accommodated.

In accordance with another aspect of the present invention there is provided a module, for mounting in a telecommunications cabinet, the module comprising housing containing electronic, electrical or optical equipment; a staggered faceplate having a front, a back, a leading end, and a trailing end, the staggered faceplate disposed on said housing; and a plurality of internal connectors, each having a front and a rear. The rear of each internal connector is connected to electrical, electronic or optical equipment. The front of the internal connectors is adapted for selective mating in a mating direction towards the front of the staggered faceplate with a plurality of external complementary connectors each secured to a cable extending generally perpendicular with respect to the mating direction and toward the trailing end of the staggered faceplate. The staggered faceplate further comprises a staggered profile between the leading end and the trailing end thereby providing a column or a row of mating surfaces. Each mating surface receives at least one of the plurality of internal connectors. Furthermore, each successive mating surface from the leading end to the trailing end is lower than the preceding one, whereby the cables secured to the external complementary connectors are at least partly accommodated.

BRIEF DESCRIPTION OF THE DRAWINGS

A detailed description of preferred embodiments is provided below with reference to the following drawings, in which:

FIG. 11 is an exploded side view of the external complementary connectors, cables, staggered faceplate, top latch, bottom latch, staggered circuit board with internal connectors and rear connector and metal housing used in a preferred embodiment of the present invention;

FIG. 12 is a rear view of the rear connector, staggered circuit board and metal housing illustrated in FIG. 11;

DETAILED DESCRIPTION OF THE PREFERRED EMBODIMENTS

Figure 1:
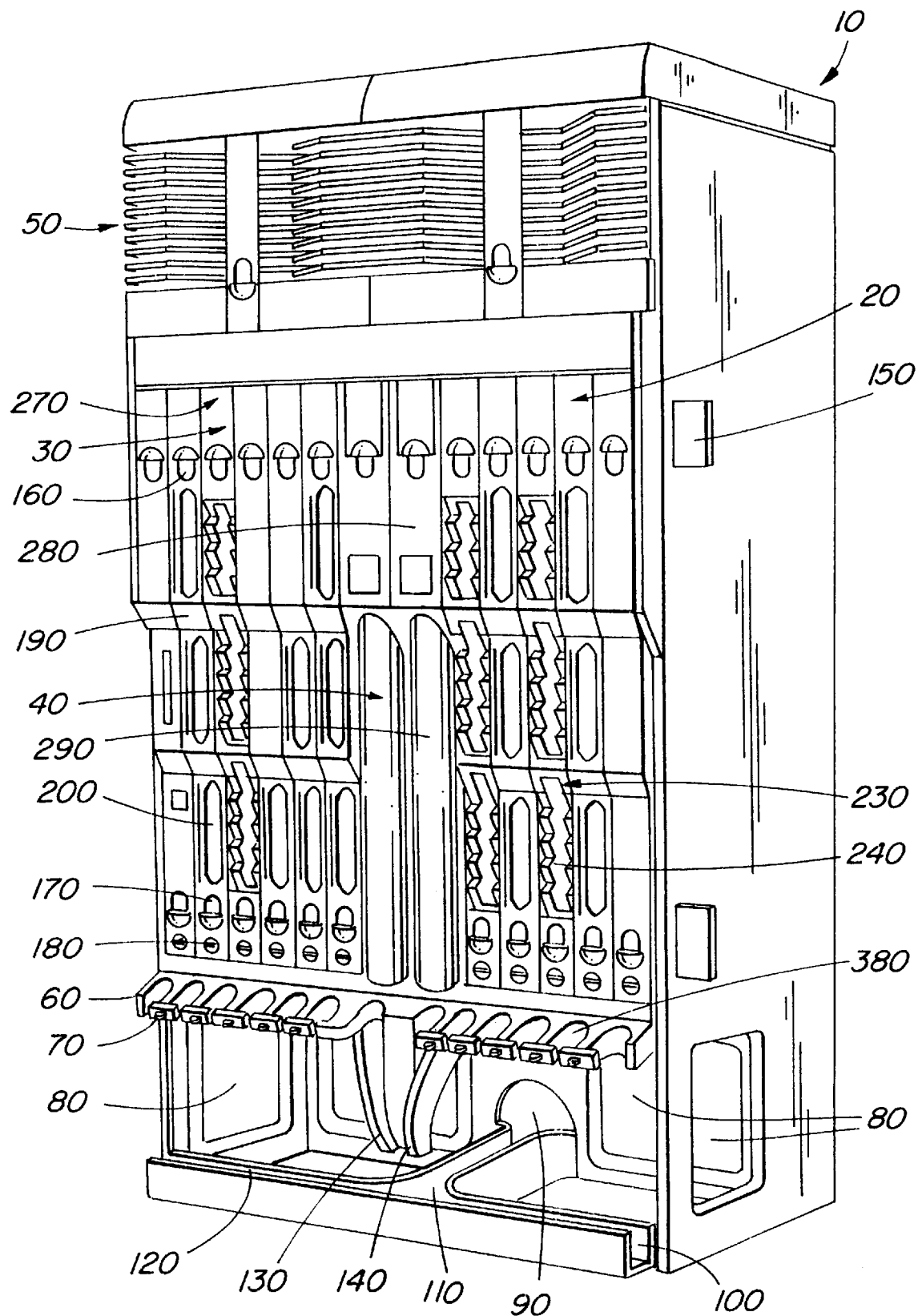
FIG. 1 is a perspective view of a piece of telecommunications equipment, housed in a cabinet, showing a number of types of modules, two of which have a faceplate and a number of internal connectors on each faceplate used in preferred embodiments of the present invention.
Figure 2:
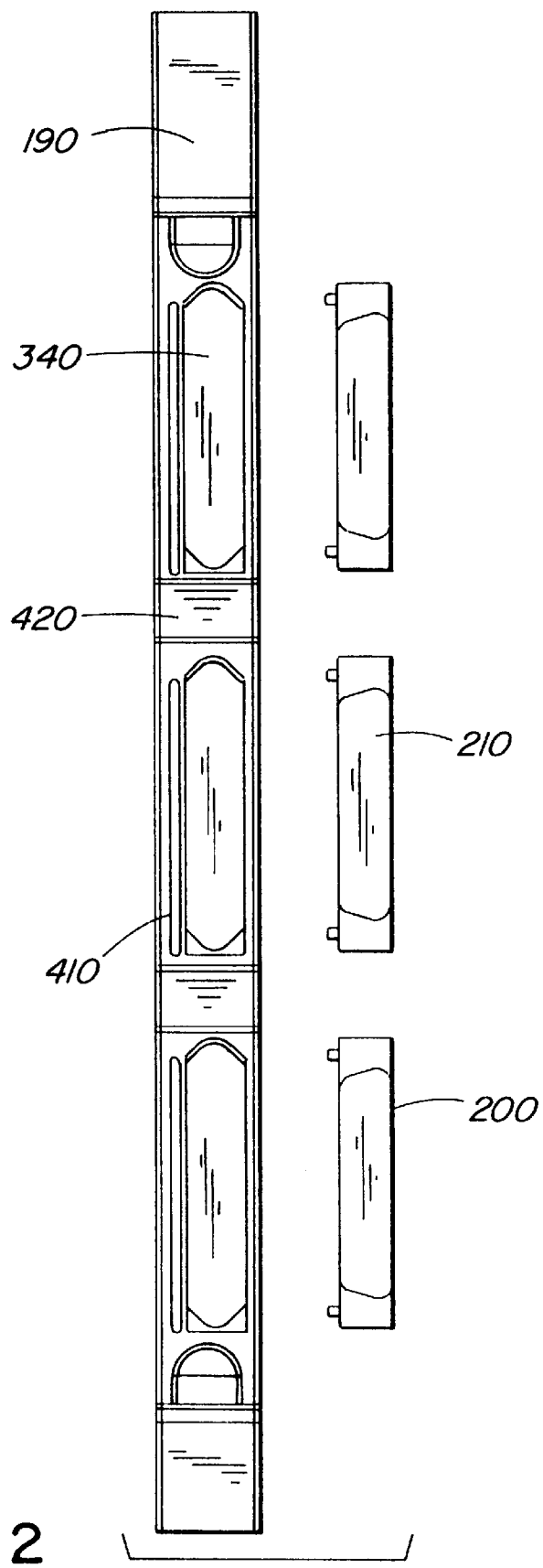
FIG. 2 is an exploded front view of the faceplate and the internal connectors used in one of the two types of modules according to a preferred embodiment of the present invention.
Figure 3:
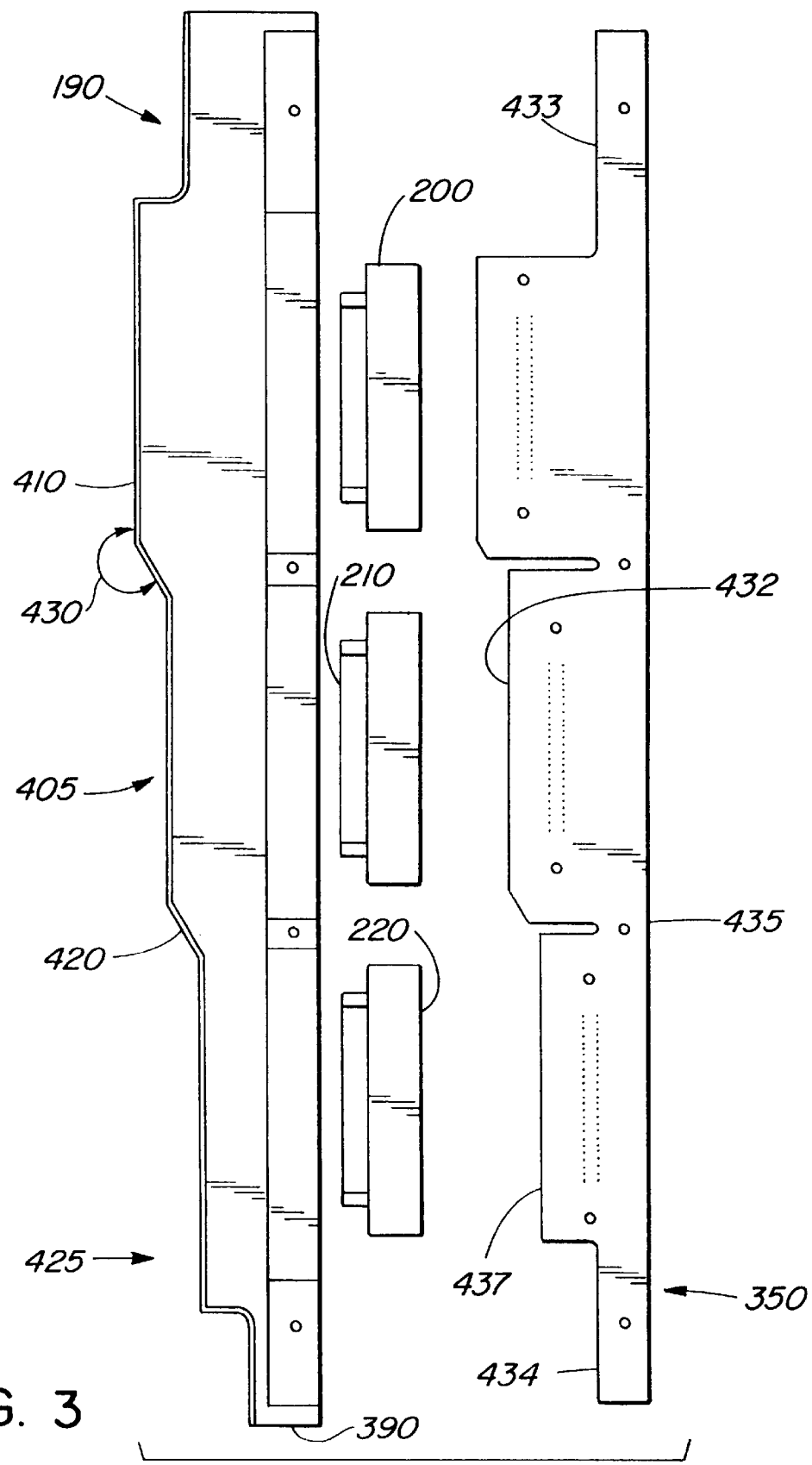
FIG. 3 is an exploded side view of the staggered faceplate and internal connectors, shown in FIG. 2, as well as a portion of a staggered circuit board used in a preferred embodiment of the present invention.

FIG. 1 shows a piece of telecommunications equipment such as a PBX switch comprising a cabinet 10 containing a plurality of modules 20, 30 and 40, and further comprising ventilation openings 50, channels 60, cable latches 70, cable openings 80, first line openings 90, second line opening 100, a first horizontal line channel 110, a second horizontal line channel 120, a first vertical line channel 130, a second vertical line channel 140 and hinges 150. The modules 20, 30 and 40 are vertically elongated and arranged side by side with the two modules 40 arranged centrally between modules 20 and 30. Modules 40 contain optical equipment and may contain electrical and electronic equipment. Modules 20 and 30 contain optical, electrical and/or electronic equipment.

Referring to FIGS. 1, 4, 10 and 15, modules 20 and 30 both have a top latch 160, a bottom latch 170, and a bottom latch lock 180. In addition, module 20 has a staggered faceplate 190 and internal connectors 200 having a front 210 and a rear 220. Module 30 has a staggered faceplate 230 and internal connectors 240 having a front 250 and a rear 260. Each module 20 and each module 30 is slid into the cabinet 10 through a front face 270 of the cabinet 10 and secured by top latch 160 and bottom latch 170. Bottom latch lock 180 helps ensure that the bottom latch 170 on module 20 or 30 does not release inadvertently. Each module 40 has a faceplate 280, a pipe 290 and a top latch 160. Each module 40 is slid into cabinet 10 through the front face 270 of cabinet 10 and secured by top latch 160.

Other means to secure modules 20, 30 or 40 in cabinet 10 can be used such as nuts and bolts or screws.

Copper lines (not shown) or fibre optic lines (not shown) from the telephone company are directed through first line opening 90 or second line opening 100, through first horizontal line channel 110 or second horizontal line channel 120 respectively, through either first vertical line channel 130 or second vertical line channel 140, and finally through a respective one of the pipes 290. If copper lines are used, the lines are connected to electrical or electronic devices in module 40; whereas, if fibre optic lines are used, the lines are connected to optical devices in module 40.

Figure 4:
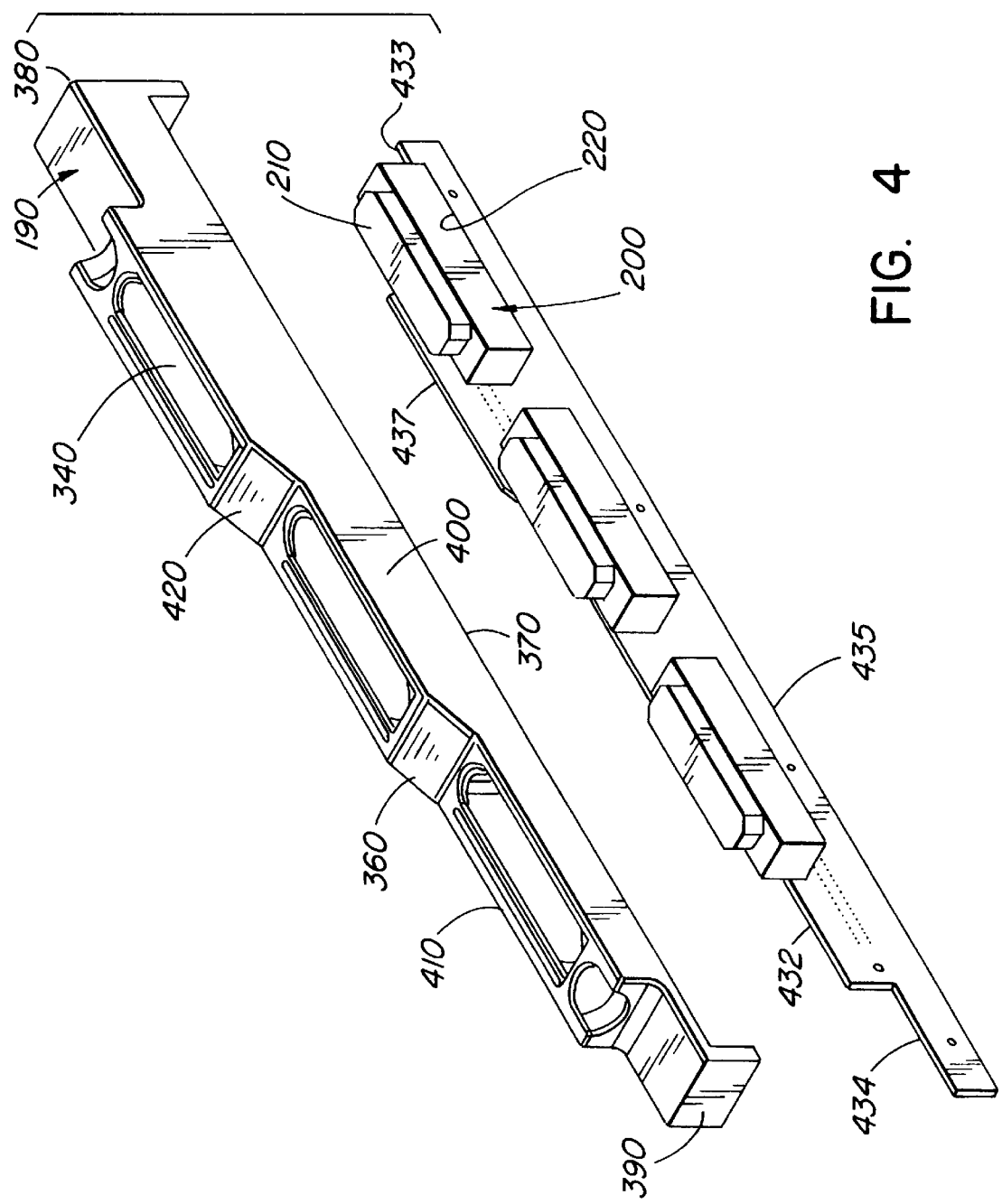
FIG. 4 is an exploded perspective view of the staggered faceplate, internal connectors and staggered circuit board shown in FIG. 3.
Figure 5:
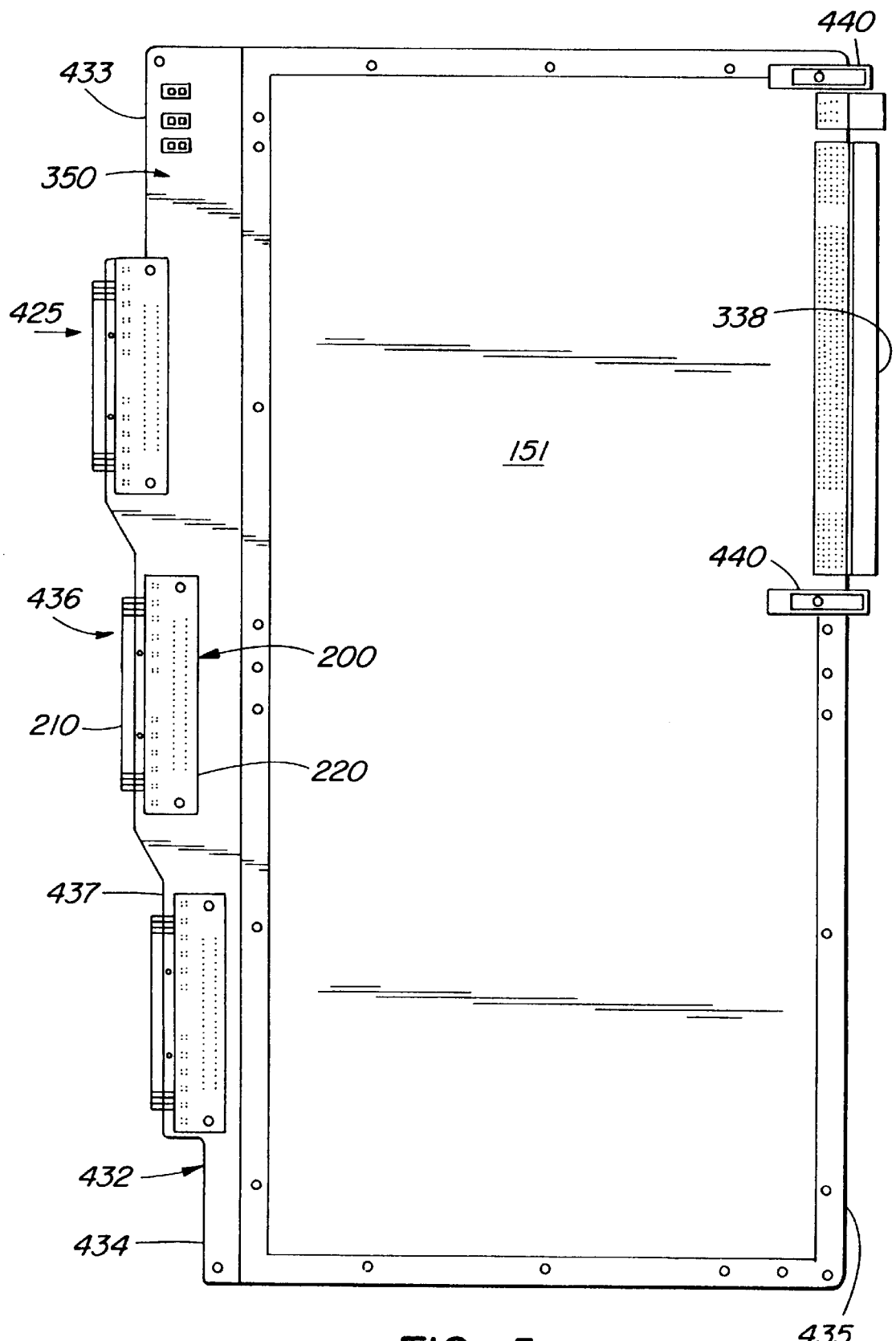
FIG. 5 is a top view of the staggered circuit board, part of which is illustrated in FIG. 3, shown with internal connectors, a rear connector and guide posts.
Figure 13:
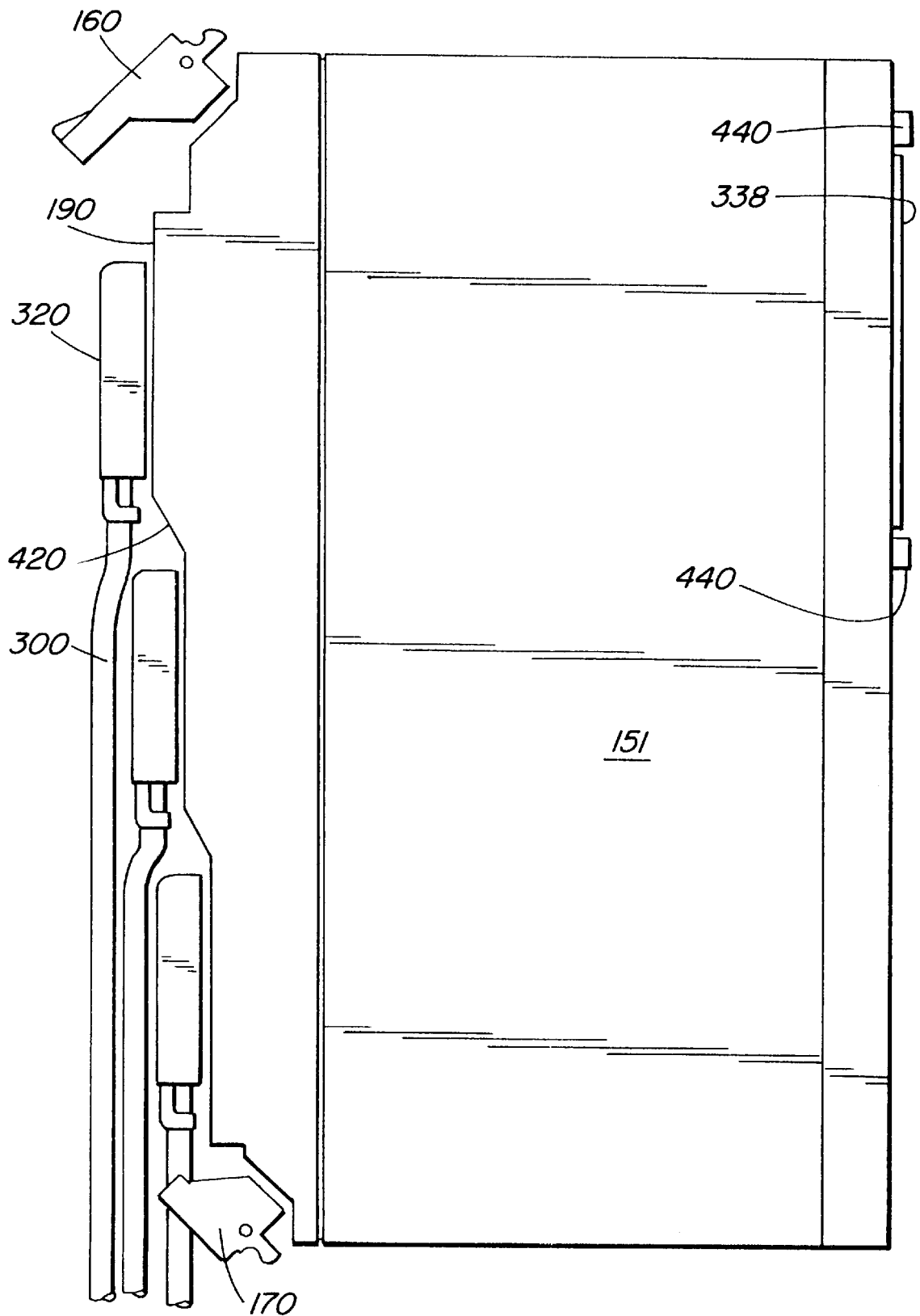
FIG. 13 is a side view of the external complementary connectors connected to the internal connectors, cables, staggered faceplate, metal housing and rear connector illustrated in FIG. 11.

Referring to FIGS. 1, 4 and 13, cables 300 are attached to external complementary connectors 320. The external complementary connectors 320 mate with the front 210 of the internal connectors 200 of module 20. Similarly, referring to FIGS. 1, 14 and 15, a second type of cable (not shown) is attached to a second type of external complementary connector (not shown). The second type of external complementary connector mates with the front 250 of the internal connector 240 of module 30. The cables 300 and the cables of the second type are directed downwards into the channels 60 and through the cable openings 80. The cable latches 70 help keep the cables 300 and the cables of the second type in their respective channels 60.

Figure 6:
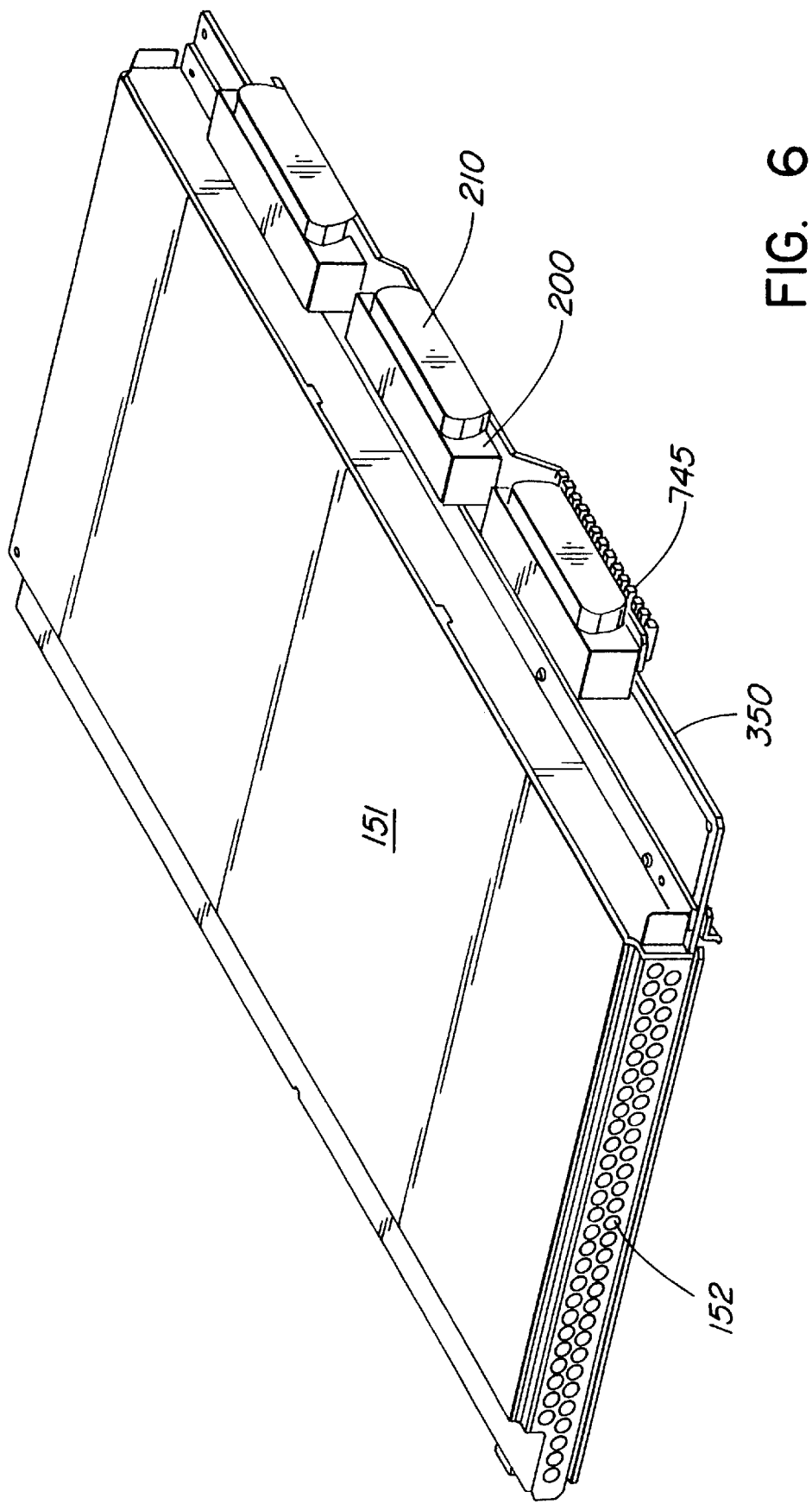
FIG. 6 is a perspective view of the staggered faceplate, internal connectors, staggered circuit board of FIGS. 2 to 5 and metal housing used in a preferred embodiment of the present invention.
Figure 7:
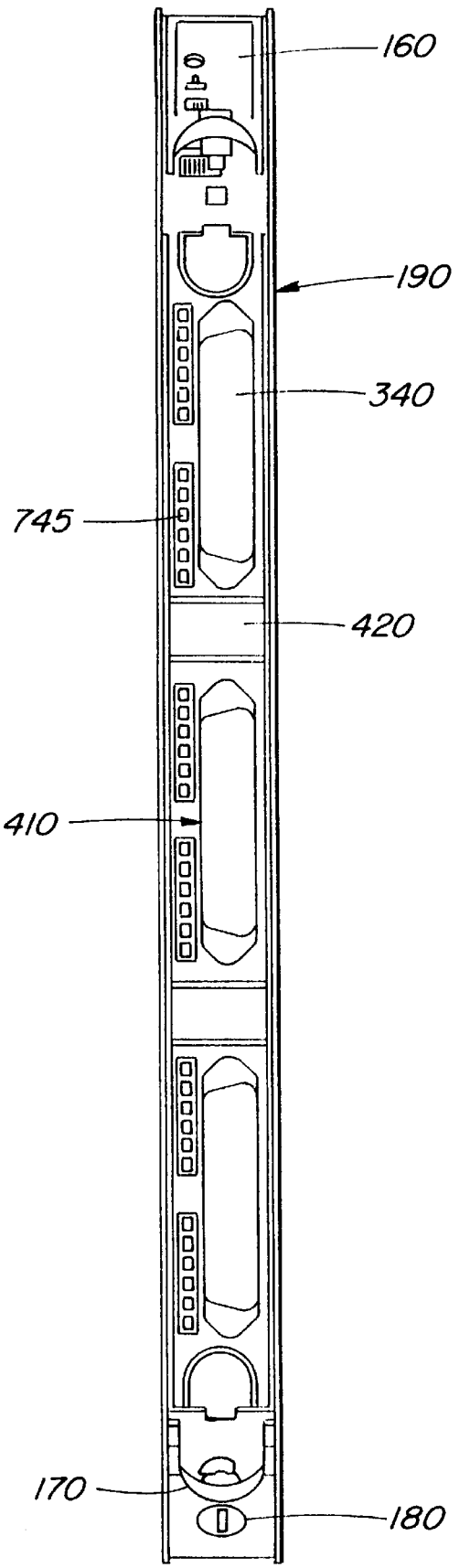
FIG. 7 is a front view of the staggered faceplate, top latch, bottom latch and bottom latch lock used in a preferred embodiment of the present invention.
Figure 8:
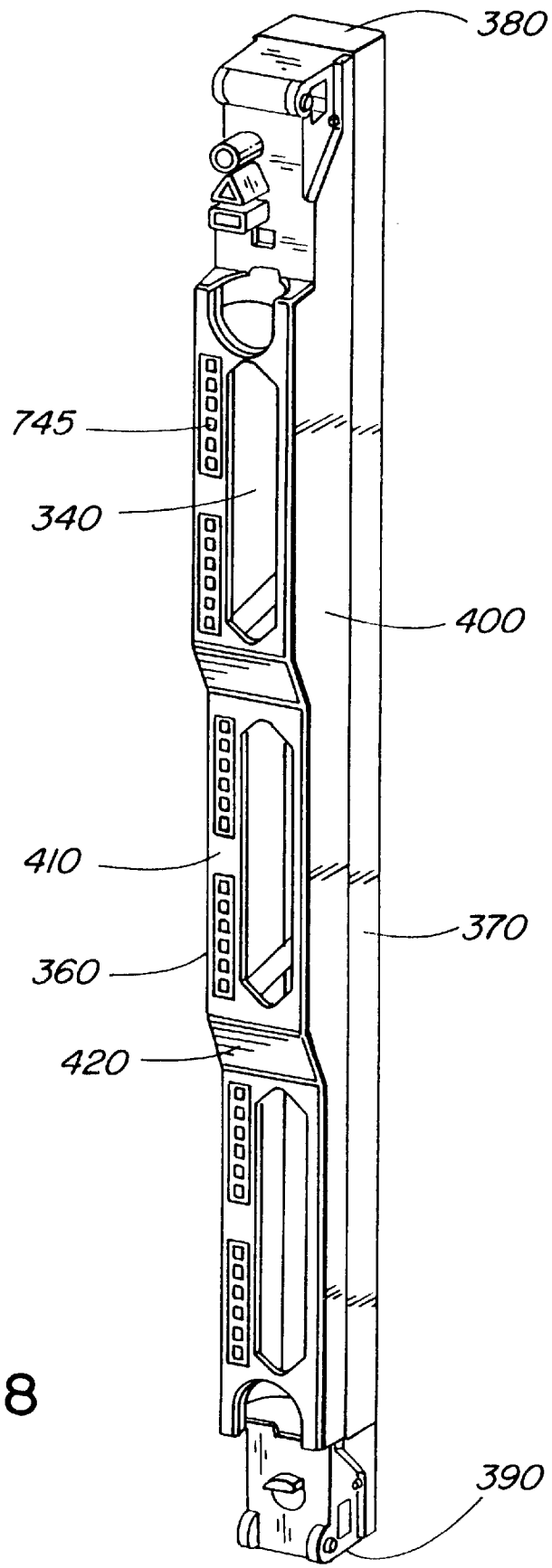
FIG. 8 is a top perspective view of the faceplate as illustrated in FIG. 7 but without a top latch, bottom latch and bottom latch lock.
Figure 9:
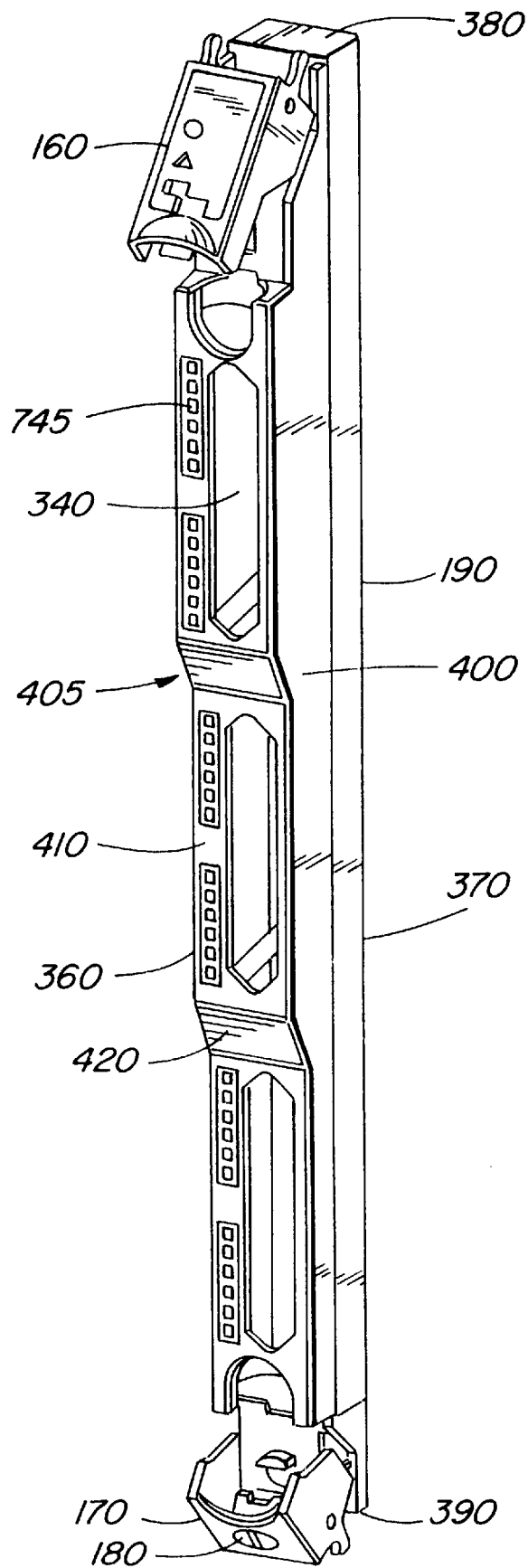
FIG. 9 is a top perspective view of the faceplate, top latch, bottom latch and bottom latch lock illustrated in FIG. 7.
Figure 10:
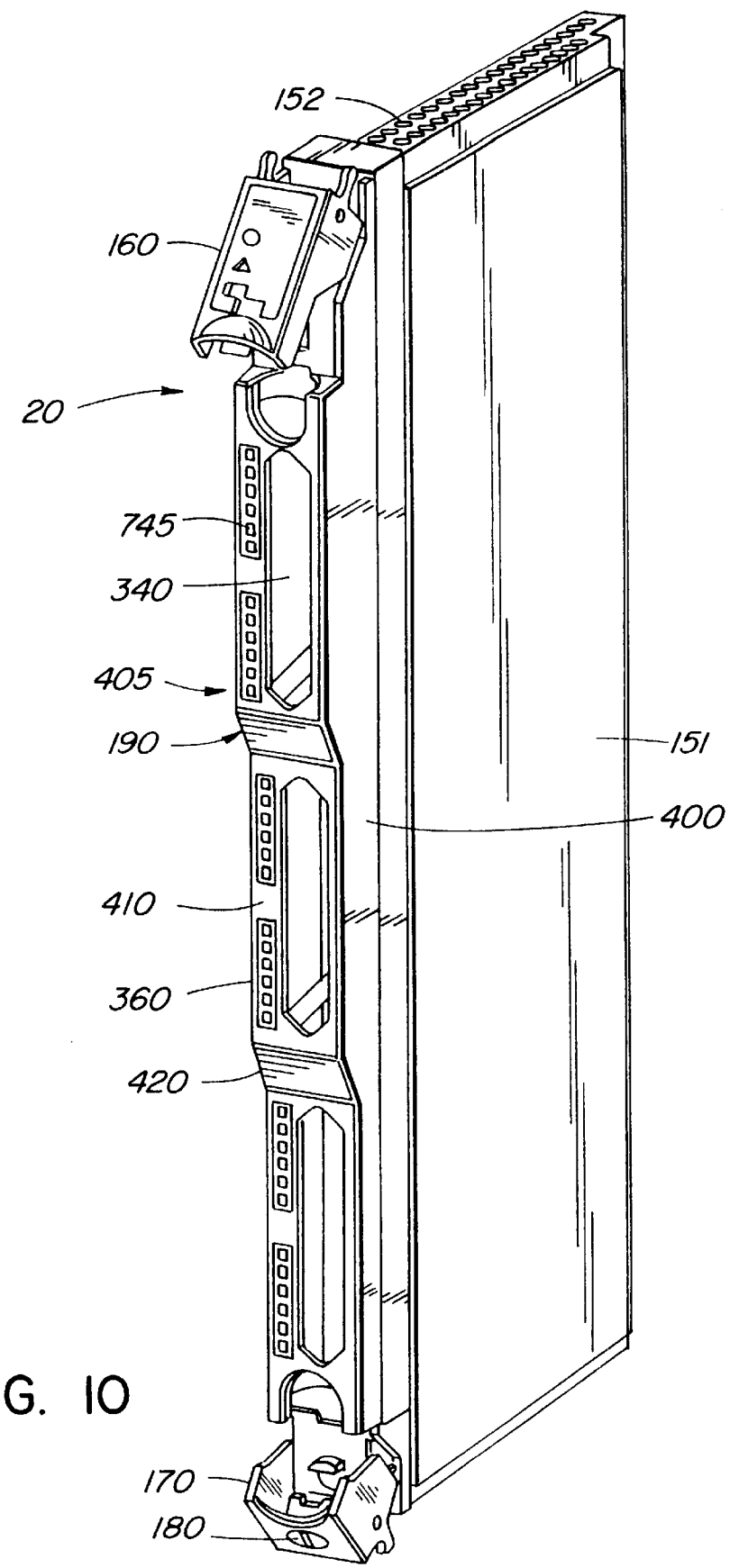
FIG. 10 is a top perspective view of the faceplate, internal connectors, top latch, bottom latch, and bottom latch lock, shown in FIG. 7, and the metal housing used in a preferred embodiment of the present invention.

Referring particularly to FIG. 6, each module 20, 30 and 40 is formed with a metal housing 151 with ventilation holes 152 running vertically from one end to the other. The ventilation openings 50 help dissipate heat generated by a power supply (not shown) used to provide power to the electrical, electronic and/or optical devices housed in modules 20, 30 and 40. The ventilation openings 50 also help to dissipate heat generated by module 20 (and by modules 30 and 40) which escape through the ventilation holes 152 in the metal housing 151.

Referring now to FIGS. 1, 5, 11, 12 and 13, the metal housing 151 of modules 20, 30 and 40 has a rear 333 which receives a rear connector 338 and female guide posts 440. When module 20, 30 or 40 is slid into place, as shown in FIG. 1, the rear connector 338 mates with a rear complementary connector (not shown) inside cabinet 10, 11 and 12. The female guide posts 440 mate with male complementary guide posts (not shown) inside cabinet 10 to help ensure that the rear connectors 338 mate properly with the rear complementary connectors (not shown) housed inside cabinet 10. Other means to ensure that the rear connectors 338 mate properly with the rear complementary connectors (not shown) housed inside cabinet 10 can be used such as male guide posts attached to circuit board 350 and female complementary guide posts. Typically the rear complementary connector (not shown) is attached to a backplane circuit board (not shown) housed inside cabinet 10. The backplane circuit board interconnects some or all of the modules 20, 30 and 40 together and provides power to modules 20, 30 and 40 via the power supply housed inside cabinet 10. Alternatively, cabling interconnects some or all of the modules 20, 30 and 40 together and provides power to modules 20, 30 and 40 via the power supply housed inside cabinet 10.

Referring again to FIG. 1, the hinges 150 are typically used to secure the cabinet 10 in a recessed wall opening.

Referring to FIGS. 4, 7, 10, 11, 12 and 13 staggered faceplate 190 has a front 360, a back 370, a leading end 380, a trailing end 390 and sides 400. The front 360 of the staggered faceplate 190 has a staggered profile 405 between the leading end 380 and the trailing end 390 providing a column of mating surfaces 410 and a column of transitional surfaces 420. Each mating surface 410 has an opening 340 to receive an internal connector 200. If necessary, the internal connectors 200 can be held in place on the staggered faceplate 190 by means of nuts and bolts or screws. The external complementary connectors 320 mate with the internal connectors 200 in a mating direction 425 which is generally perpendicular to the respective mating surface 410.

Each successive mating surface from the leading end 380 to the trailing end 390 is lower than the preceding mating surface whereby, as shown in FIG. 13, the cables 300 attached to the external complementary connectors 320 are at least partly accommodated. That is to say, each successive mating surface 410 is lower than the preceding one by an amount, preferably equal to or greater than the diameter of cable 300, such that an external complementary connector 320 does not interfere with or only slightly interferes with another cable 300 running from a higher external complementary connector 320. In this way, the cables 300 can extend vertically with little or no bending.

Angle 430 formed between the preceding mating surface and the transitional surface 420 on the front 360 of the faceplate 190 must be greater than 180 degrees and less than or equal to 270 degrees. Typically angle 430 is 225 degrees. In addition, the mating surfaces 410 are generally perpendicular to the leading end 380 of the staggered faceplate 190. Alternatively, the mating surfaces 410 can all either be at an obtuse or acute angle from the leading end 380 of the staggered faceplate 190.

Typically, the rear end 220 of each internal connector 200 is attached to a staggered circuit board 350 as shown in FIGS. 2, 3, 4, 5, and 6. The staggered circuit board 350 has a front side 432, with a leading surface 433 and a trailing surface 434, and a rear side 435. The front side 432 has a staggered profile 436 between the leading surface 433 and the trailing surface 434 that generally matches the staggered profile 405 of the staggered faceplate 190. The staggered profile 436 provides a column of circuit board surfaces 437 upon which the rear end 220 of the internal connectors 200 are attached. Typically the rear end 220 of each internal connector 200 is attached to the staggered circuit board 350 by soldering. Other means to attach the rear ends 200 of the internal connectors 200 to the staggered circuit board 350 can be used such as clamping devices or other mechanical means.

FIGS. 6, 7, 8, 9 and 10 show optional light pipes 745 received by the staggered faceplate 190. The optional light pipes 745 are attached to the staggered circuit board 350 and allow LED's attached to the staggered circuit board 350 to be seen from the front 360 of the staggered faceplate 190. The LED's convey various information to the user of the telecommunications equipment.

Figure 14:
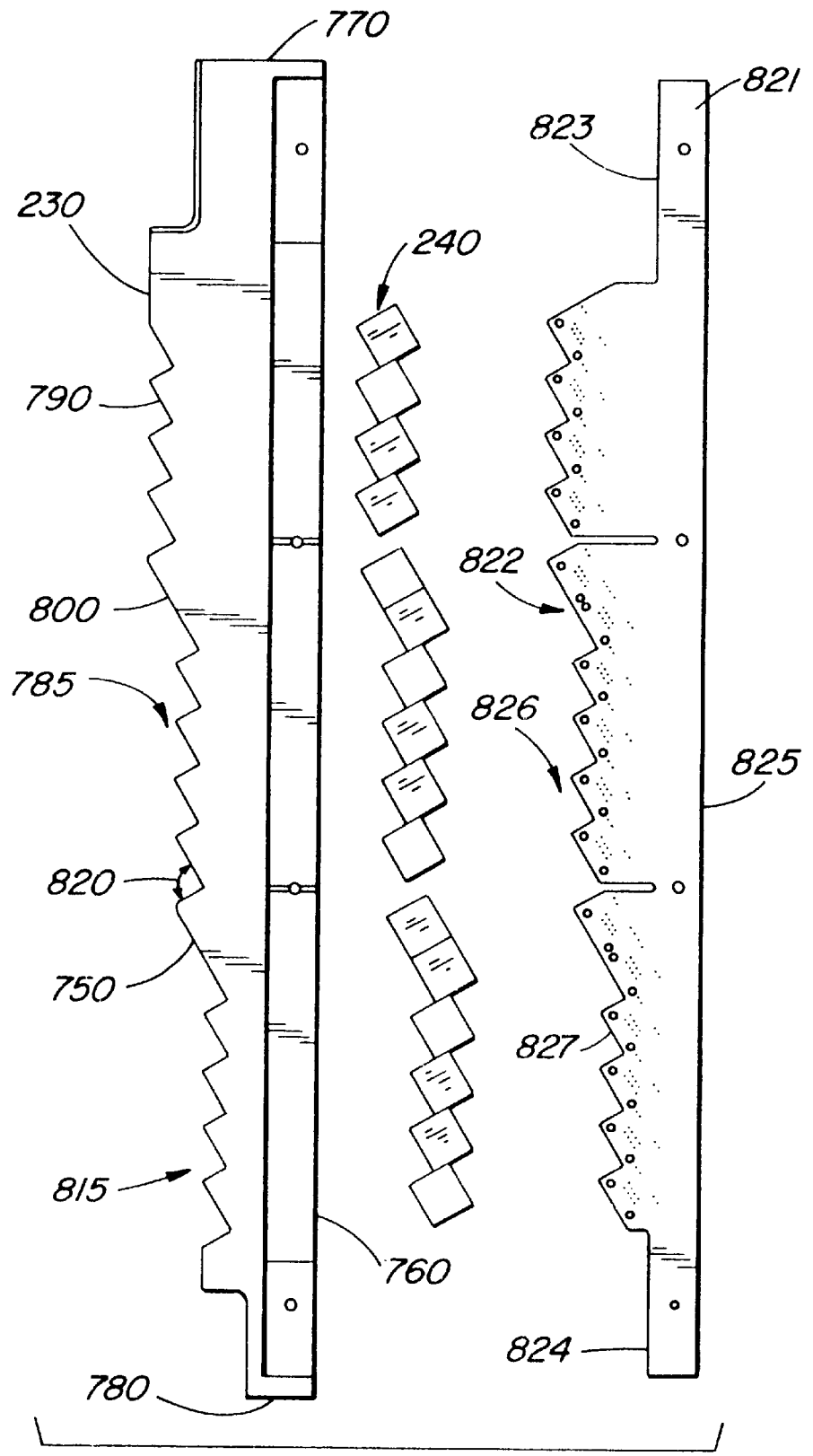
FIG. 14 is an exploded side view of a staggered faceplate, internal connectors and staggered circuit board used in another preferred embodiment of the present invention.
Figure 15:
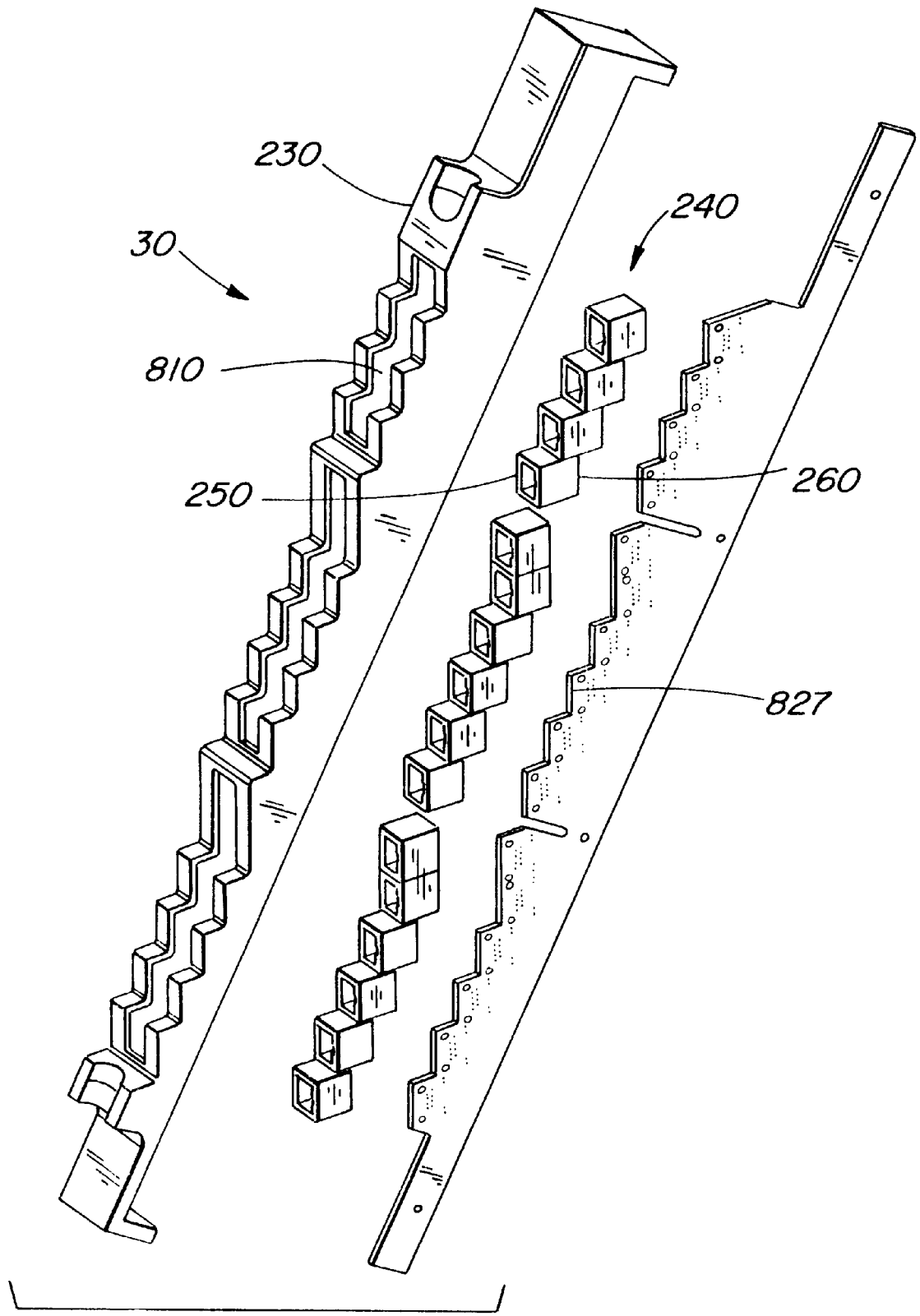
FIG. 15 is an exploded perspective view of the staggered faceplate, internal connectors and staggered circuit board illustrated in FIG. 14.

FIGS. 14 and 15 show another preferred embodiment of the present invention. A staggered faceplate 230 of module 30 has a front 750, a rear 760, a leading end 770 and a trailing end 780. The front 750 of the staggered faceplate 230 has a staggered profile 785 between the leading end 770 and the trailing end 780 providing a column of mating surfaces 790 and a column of transitional surfaces 800. Each mating surface 790 and each transitional surface 800 have a plurality of openings 810 to receive a respective plurality of internal connectors 240. If necessary, the internal connectors 240 can be held in place on the staggered faceplate 230 by means of nuts and bolts or screws. The second type of external complementary connectors mate with the internal connectors 240 in a mating direction 815 which is generally perpendicular to the respective mating surface 410. The second type of external complementary connectors attached to the second type of cables (not shown) mate with the internal connectors 240. Each successive mating surface from the leading end 770 to the trailing end 780 is lower than the preceding mating surface whereby, the second type of cables attached to the second type of external complementary connectors are at least partly accommodated. That is to say, each successive mating surface 790 is lower than the preceding one by an amount, preferably equal to or greater than the diameter of the second type of cable, such that a second type of external complementary connector does not interfere with or only slightly interferes with a second type of cable running from a higher second type of external complementary connector. In this way, the second type of cables can extend vertically with little or no bending.

Angle 820 formed between the preceding mating surface and the transitional surface 800 on the front 750 of the faceplate 230 is typically 90 degrees. In addition, the mating surfaces 790 are generally at an obtuse angle from the leading end 770 of the staggered faceplate 230. Alternatively, the mating surfaces 790 can be at an acute angle from the leading end 770 of the staggered faceplate 230.

Typically, the rear end 260 of each internal connector 240 is attached to a staggered circuit board 821. The staggered circuit board 821 has a front side 822, with a leading surface 823 and a trailing surface 824, and a rear side 825. The front side 822 has a staggered profile 826 between the leading surface 823 and the trailing surface 824 that generally matches the staggered profile 785 of the staggered faceplate 230. The staggered profile 826 provides a column of circuit board surfaces 827 upon which the rear end 260 of the internal connectors 240 are attached. Typically the rear end 260 of each internal connectors 240 is attached by soldering methods. Other means to attach the rear ends 260 of the internal connectors 240 to the staggered circuit board 821 can be used such as clamping devices or other mechanical means.

Referring to FIGS. 2, 3, 4, 5, 14 and 15, internal connector 200 of module 20 is a TP 50 female connector (a 50 pin female connector). Internal connector 240 of module 30 is a RG45 female connector (an 8 pin female connector). Other types of internal connectors can be used including the male versions of the TP50 and RG45 connectors.

External complementary connector 320 and the second type of external complementary connector are a male TP50 (50 pin) connector and a male RG45 (8 pin) connector respectively. Other types of external complementary connectors can be used as long as they mate with the internal connectors 200 and 240 respectively.

In each of the preferred embodiments discussed above, the staggered faceplate 190 or 230 is typically made of metal. However, other materials such as plastic can be used.

Other variations and modifications of the invention are possible. For example, modules 20, 30 and 40 may be horizontally elongated and arranged side by side. Consequently, staggered faceplate 190 of module 20 would have a staggered profile 405 providing a row of mating surfaces 410 and a row of transitional surfaces 420. Each successive mating surface 410 is lower than the preceding one whereby cables 300 secured to external complementary connectors 320 are at least partly accommodated. Similarly, staggered faceplate 230 of module 30 would have a staggered profile 785 providing a row of mating surfaces 790 and a row of transitional surfaces 800. Each successive mating surface 790 is lower than the preceding one whereby the second type of cables secured to the second type of external complementary connectors are at least partly accommodated. In addition, staggered circuit board 350 for module 20 would have a staggered profile 436 providing a row of circuit board surfaces 437. Typically, the rear end 220 of each internal connector would be attached to a circuit board surface 437.

Similarly, staggered circuit board 821 for module 30 would have a staggered profile 826 providing a row of circuit board surfaces 827. Typically, the rear end 260 of each internal connector 240 would be attached to a circuit board surface 827.

All such modifications or variations are believed to be within the sphere and scope of the invention as defined by the claims appended hereto.

We claim:

1. A connector assembly for interconnecting electrical, electronic or optical equipment to external connectors comprising:

a staggered faceplate having a front, a back, a leading end, and a trailing end;

a plurality of internal connectors each having a front and a rear, the rear of each internal connector connected to electrical, electronic or optical equipment, the front of the internal connectors adapted for selective mating in a mating direction towards the front of the staggered faceplate with a plurality of external complementary connectors each secured to a cable extending generally perpendicular with respect to the mating direction and toward the trailing end of the staggered faceplate;

and wherein the staggered faceplate further comprises a staggered profile between the leading end and the trailing end, thereby providing a column or a row of mating surfaces, each mating surface receiving at least one of the plurality of internal connectors, each successive mating surface from the leading end to the trailing end being lower than the preceding one, whereby the cables secured to the external complementary connectors are at least partly accommodated.

2. A connector assembly according to claim 1, wherein each mating surface receives only one of the plurality of internal connectors.

3. A connector assembly according to claim 1, wherein each successive mating surface is lower than the preceding one by at least the diameter of the cable secured to the external complementary connector mated to the front of the internal connector received by the preceding mating surface.

4. A connector assembly according to claim 1, wherein each mating surface receives only one of the plurality of internal connectors and wherein each successive mating surface is lower than the preceding one by at least the diameter of the cable secured to the external complementary connector mated to the front of the internal connector received by the preceding mating surface.

5. A connector assembly according to claim 4, wherein the mating surfaces are generally perpendicular to the leading end of the staggered faceplate.

6. A connector assembly according to claim 4, wherein the mating surfaces are at the same acute angle from the leading end of the staggered faceplate.

7. A connector assembly according to claim 4, wherein the mating surfaces are at the same obtuse angle from the leading end of the staggered faceplate.

8. A connector assembly according to claim 4, wherein the connector assembly further comprises a staggered circuit board and wherein the rear of the internal connectors are connected to the staggered circuit board.

9. A connector assembly according to claim 4, wherein the connector assembly further comprises a staggered circuit board having a leading end and a trailing end and a staggered profile between the leading end and the trailing end, thereby providing a column or a row of circuit board surfaces, each circuit board surface being connected to the rear of a respective one of the plurality of internal connectors received by the respective mating surface; each successive circuit board surface being lower than the preceding circuit board surface by the same distance that each respective mating surface is lower than the preceding mating surface.

10. A connector assembly according to claim 4, wherein each respective internal connector is secured to each respective mating surface of said staggered faceplate.

11. A module for mounting in a telecommunications cabinet, the module comprising:

a housing containing electronic, electrical or optical equipment;

a staggered faceplate having a front, a back, a leading end, and a trailing end, the staggered faceplate disposed on said housing;

a plurality of internal connectors, each having a front and a rear, the rear of each internal connector connected to electrical, electronic or optical equipment, the front of the internal connectors adapted for selective mating in a mating direction towards the front of the staggered faceplate with a plurality of external complementary connectors each secured to a cable extending generally perpendicular with respect to the mating direction and toward the trailing end of the staggered faceplate;

and wherein the staggered faceplate further comprises a staggered profile between the leading end and the trailing end thereby providing a column or a row of mating surfaces, each mating surface receiving at least one of the plurality of internal connectors, each successive mating surface from the leading end to the trailing end being lower than the preceding one, whereby the cables secured to the external complementary connectors are at least partly accommodated.

12. A module according to claim 11, wherein each mating surface receives only one of the plurality of internal connectors.

13. A module according to claim 11, wherein each successive mating surface is lower than the preceding one by at least the diameter of the cable secured to the external complementary connector mated to the front of the internal connector received by the preceding mating surface.

14. A module according to claim 11, wherein each mating surface receives only one of the plurality of internal connectors and wherein each successive mating surface is lower than the preceding one by at least the diameter of the cable secured to the external complementary connector mated to the front of the internal connector received by the preceding mating surface.

15. A module according to claim 14, wherein the mating surfaces are generally perpendicular to the leading end of the staggered faceplate.

16. A module according to claim 14, wherein the mating surfaces are at the same acute angle from the leading end of the staggered faceplate.

17. A module according to claim 14, wherein the mating surfaces are at the same obtuse angle from the leading end of the staggered faceplate.

18. A module according to claim 14, wherein the module further comprises a staggered circuit board and wherein the rear of the internal connectors are connected to the staggered circuit board.

19. A module according to claim 14, wherein the module further comprises a staggered circuit board having a leading end and a trailing end and a staggered profile between the leading end and the trailing end, thereby providing a column or a row of circuit board surfaces, each circuit board surface being connected to the rear of a respective one of the plurality of internal connectors received by the respective mating surface; each successive circuit board surface being lower than the preceding circuit board surface by the same distance that each respective mating surface is lower than the preceding mating surface.

20. A module according to claim 14, wherein each respective internal connector is secured to each respective mating surface of said staggered faceplate.

* * * * *